(12) United States Patent
Farrar et al.

(10) Patent No.: US 6,861,287 B2
(45) Date of Patent: Mar. 1, 2005

(54) MULTIPLE CHIP STACK STRUCTURE AND COOLING SYSTEM

(75) Inventors: Paul A. Farrar, Burlington, VT (US); Jerome M. Eldridge, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/662,828

(22) Filed: Sep. 15, 2003

(65) Prior Publication Data

US 2004/0063248 A1 Apr. 1, 2004

Related U.S. Application Data

(62) Division of application No. 09/945,042, filed on Aug. 31, 2001, now Pat. No. 6,686,654.

(51) Int. Cl.[7] .............................................. H01L 21/44
(52) U.S. Cl. ..................... 438/109; 438/107; 438/106
(58) Field of Search .............................. 438/106, 107, 438/108, 109; 257/686, 685, 723

(56) References Cited

U.S. PATENT DOCUMENTS

| | | |
|---|---|---|
| 3,247,446 A | 11/1961 | Krsek |
| 3,548,915 A | 12/1970 | Reading et al. |
| 3,548,948 A | 12/1970 | Reading et al. |
| 3,687,737 A | 8/1972 | Krock et al. |
| 4,389,429 A | 6/1983 | Soclof |
| 4,525,921 A | 7/1985 | Carson et al. |
| 4,561,173 A | 12/1985 | Te Velde |
| 4,617,160 A | 10/1986 | Belanger et al. |
| 4,706,166 A | 11/1987 | Go |
| 4,754,316 A | 6/1988 | Reid |
| 4,868,712 A * | 9/1989 | Woodman .................... 361/689 |
| 4,962,058 A | 10/1990 | Cronin et al. |
| 4,963,976 A | 10/1990 | Fluegel et al. |
| 5,202,754 A | 4/1993 | Bertin et al. |
| 5,270,261 A | 12/1993 | Bertin et al. |
| 5,270,572 A | 12/1993 | Nakajima et al. |
| 5,296,741 A | 3/1994 | Kim |
| 5,324,683 A | 6/1994 | Fitch et al. |
| 5,324,684 A | 6/1994 | Kermani et al. |
| 5,336,914 A | 8/1994 | Andoh |
| 5,347,428 A | 9/1994 | Carson et al. |
| 5,408,742 A | 4/1995 | Zaidel et al. |
| 5,444,105 A | 8/1995 | Ornstein |
| 5,457,334 A | 10/1995 | Nishimoto |
| 5,478,781 A | 12/1995 | Bertin et al. |
| 5,506,753 A | 4/1996 | Bertin et al. |
| 5,509,468 A | 4/1996 | Lopez |

(List continued on next page.)

FOREIGN PATENT DOCUMENTS

EP    0 315 792 A2    10/1988

OTHER PUBLICATIONS

"The New Low-k Candidate: It's A Gas"; Semiconductor International; Mar. 1999, p. 38.
E. Jan Vardaman; "Future Packaging Trends: CSP vs. Flip Chip"; Proceedings of the 11th European Microelectronics Conference; 1997; p. 295–99.
A.J. Blodgett and D.R. Barbour; "Thermal Conduction Module: A High-Performance MULTILAYER Ceramic Package"; IBM Journal of Research and Development, vol. 26 No. 1; Jan. 1982; p. 30–36.

*Primary Examiner*—Brad Smith
(74) *Attorney, Agent, or Firm*—Knobbe, Martens, Olson & Bear LLP

(57) ABSTRACT

An electronic package comprised of multiple chip stacks attached together to form a single, compact electronic module. The module is hermetically sealed in an enclosure. The enclosure comprises a pressurized, thermally conductive fluid, which is utilized for cooling the enclosed chip stack. A structure that allows for densely-packed, multiple chip stack electronic packages to be manufactured with improved heat dissipation efficiency, thus improving the performance and reliability of the multi-chip electronic packages.

8 Claims, 8 Drawing Sheets

U.S. PATENT DOCUMENTS

| | | |
|---|---|---|
| 5,510,645 A | 4/1996 | Fitch et al. |
| 5,578,146 A | 11/1996 | Grant et al. |
| 5,581,498 A | 12/1996 | Ludwig et al. |
| 5,593,926 A | 1/1997 | Fujihira |
| 5,652,462 A | 7/1997 | Matsunaga et al. |
| 5,737,192 A | 4/1998 | Linderman |
| 5,754,405 A | 5/1998 | Derouiche |
| 5,891,797 A | 4/1999 | Farrar |
| 5,907,178 A | 5/1999 | Baker et al. |
| 5,910,682 A | 6/1999 | Song |
| 5,936,840 A | 8/1999 | Satwinder |
| 5,994,777 A | 11/1999 | Farrar |
| 6,008,530 A | 12/1999 | Kano |
| 6,014,313 A | 1/2000 | Hesselbom |
| 6,025,642 A | 2/2000 | Burns |
| 6,115,242 A | 9/2000 | Lambrecht |
| RE36,916 E | 10/2000 | Moshayedi |
| 6,133,626 A | 10/2000 | Hawke et al. |
| 6,169,325 B1 | 1/2001 | Azuma et al. |
| 6,222,737 B1 | 4/2001 | Ross |
| D459,317 S | 6/2002 | Fukumoto et al. |
| 6,410,859 B1 | 6/2002 | King |
| 6,506,981 B1 | 1/2003 | Liberkowski |
| 6,747,347 B2 * | 6/2004 | Farrar et al. ............... 257/686 |
| 2003/0015781 A1 | 1/2003 | Frrar |

* cited by examiner

MULTIPLE CHIP STACK STRUCTURE AND COOLING SYSTEM

RELATED APPLICATIONS

This application is a divisional application of U.S. patent application Ser. No. 09/945,042, now U.S. Pat. No. 6,686,654, filed Aug. 31, 2001 entitled "MULTI-CHIP STACK AND COOLING SYSTEM." This application is also related to U.S. patent application Ser. No. 09/945,024, now U.S. Pat. No. 6,747,347, filed Aug. 30, 2001 entitled "MULTI-CHIP ELECTRONIC PACKAGE AND COOLING SYSTEM" the entirety of which is incorporated by reference.

BACKGROUND OF THE INVENTION

1. Field of the Invention

The present invention relates to semiconductor processing technology and, in particular, concerns an electronic module comprised of multiple chip stacks assembled into a single electronic package having improved heat dissipation.

2. Description of the Related Art

Semiconductor manufacturers continually strive to increase the packaging density of integrated circuit chips, which has led to the development of high-density electronic packaging modules such as three-dimensional multi-chip structures. Multi-chip structures typically comprise a plurality of integrated circuit chips that are adhered together in a stack so as to reduce the amount of space that the chips occupy inside a system. Typically, each chip in the stack has a plurality of conductive input/output contacts that are exposed on at least one lateral surface of the chip. The exposed contacts provide conductive interconnection between the chips in the stack and external circuitry.

As a result of the increased device density of VLSI (Very-Large-Scale Integration) and ULSI (Ultra-Large-Scale Integration) integrated circuitry, wiring interconnective metallurgy between input/output terminals of stacked integrated circuit chips has become increasingly more complex. A higher packaging density likely requires an increase in the number of conductors, which likely reduces the space between adjacent conductors. Unfortunately, such dimensional reductions tend to increase the capacitance between adjacent conductors, thereby possibly increasing signal propagation delays and signal cross-talk. The limitations brought about by capacitive coupling between adjacent conductors has become a significant impediment to achieving higher wiring density.

The capacitive coupling effect is particularly apparent in high-density electronic packaging modules, such as three-dimensional multi-chip structures. In some multichip structures, the conductive leads on the integrated circuit chips are closely spaced, and adjacent leads may sometimes be separated by less than 1 micron. Consequently, reducing the distance between adjacent leads may adversely impact the functionality of the multi-chip structure due to an increase in the capacitive load between adjacent conductors. In addition, stacking the chips in close proximity to one another as required in multi-chip structures may also increase the capacitive coupling effect between conductors of adjacent chips.

Many integrated circuit chip designers have tried to address the problem of increased capacitive coupling between adjacent conductors by utilizing insulative materials that have lower dielectric constants than conventional dielectrics such as silicon-dioxide ($SiO_2$). which has a dielectric constant of about 4.5. In some cases, polymers, such as polyimides, which have a dielectric constant of about 2.8–3.5, have been used in place of $SiO_2$. However, the polyimides provide limited improvement for the capacitive coupling problem and, therefore, do not provide a significant advantage in use.

Alternatively, interconnects incorporating an air bridge structure have also been developed and are described in prior art references such as U.S. Pat. No. 5,891,797 to Farrar. Air bridge structures generally comprise suspended conductors that are surrounded by an air gap instead of the more conventional insulators. For example, U.S. Pat. No. 5,324,683 to Fitch et al. describes the formation of an air bridge structure in an integrated circuit by removing all or a portion of the dielectric layer between conductors so that the conductors are surrounded and insulated by an air gap. Air has a dielectric constant of approximately 1.0, which is substantially less than the dielectric constants of conventionally used insulators such as $SiO_2$ or various polymides. As such, the air-gap insulator provides some improvement for the capacitive coupling effect associated with the increased wiring density of integrated circuit chips.

Although air bridge structures permit an increase in the integrated circuit wiring density, the use of air bridges introduces some new problems such as the effective removal of heat from the air bridge structures. Generally, increasing the integrated circuit wiring density leads to a decrease in the cross-sectional area of the conductors. As the cross-sectional area of an air bridge conductor decreases, the electrical resistance of the conductor increases, which results in an increase of the operating temperature of the conductors.

Excessive heat generation is particularly apparent in high-density multi-chip electronic packages, such as multi-chip modules or three-dimensional multi-chip structures. As the number of components in a multi-chip electronic package increases and the packaging density becomes more compact, the ability of heat to dissipate efficiently diminishes, which increases the risk of self-overheating and may reduce the reliable life of the semiconductor device. Moreover, integrated circuit and device functional characteristics may also depend on ambient temperature within the multi-chip electronic package. Therefore, as the ambient temperature of the package increases due to excessive heat generated by the conductors, hot spots within the multi-chip electronic package may form and adversely affect the performance of the integrated circuit.

Hence, from the foregoing, it will be appreciated that there is a need for an electronic module having higher wiring density combined with an efficient cooling system that effectively removes heat from the module. What is proposed herein is a densely packed electronic module having improved heat dissipation efficiency and a process of manufacturing the same.

SUMMARY OF THE INVENTION

In one aspect, the preferred embodiments of the present invention provide an electronic packaging module comprising a plurality of first integrated circuit chips stacked and secured together to form a first chip stack having a first lateral face that is comprised of a first portion of each chip. The module further comprises a plurality of second integrated circuit chips stacked and secured together to form a second chip stack having a first lateral face that is comprised of a first portion of each chip. The first lateral face of the first chip stack is attached to the first lateral face of the second chip stack so as to form a single, electronic module. Preferably, at least one of the chip stacks is electrically interconnected to external circuitry. Furthermore, a plurality of exterior chips can be mounted to the remaining exposed faces of the chip stacks. In one embodiment, the chips within the chip stacks comprise memory chips while the exterior chips comprise non-memory chips such as processor chips and logic chips. In another embodiment, the module is enclosed inside an enclosure, wherein the enclosure is configured to receive and enclose a thermally conductive fluid having a thermal conductivity greater than that of air at one atmosphere.

In another aspect, the preferred embodiments provide an electronic packaging module comprising a plurality of chip stacks. Each chip stack comprises a plurality of outer faces, wherein the chip stacks are attached together to form a single module in a manner such that at least one outer face of each chip stack is bonded to the outer face of another chip stack. Preferably, electrical contacts are formed on at least some of the outer faces of at least some of the chip stacks so as to establish electrical contact between at least some of the chip stacks. Preferably, at least one of the chip stacks is interconnected to external circuitry. In one embodiment, the module further comprises an enclosure enclosing the chip stacks, wherein the enclosure is configured to receive and enclose a thermally conductive fluid having a thermal conductivity greater than that of air at one atmosphere, wherein said thermally conductive fluid contacts the chip stacks and transfers heat therefrom.

In yet another aspect, the preferred embodiments of the present invention provide a method of forming an electronic packaging module. The method comprises securing a first plurality of integrated circuit chips in a first chip stack, wherein the first chip stack comprises a first lateral face wherein the first lateral face comprises a portion of each chip. Furthermore, a second plurality of integrated circuit chips are secured in a second chip stack, wherein the second chip stack comprises a first lateral face wherein the first lateral face comprises a portion of each chip. The method further comprises bonding the first lateral face of the first chip stack to the first lateral face of the second chip stack so as to form a single module and, preferably, electrically interconnecting the module to a bonding substrate, wherein the bonding substrate comprises external circuitry. In one embodiment, the method further comprise enclosing said module inside an enclosure and introducing a thermally conductive fluid to said enclosure, said thermally conductive fluid has a thermal conductivity greater than that of air at one atmosphere, wherein said thermally conductive fluid contacts the chip stacks and transfers heat therefrom.

Advantageously, the preferred embodiments of the present invention provide an electronic module that is comprised of multiple chip stacks combined into a single, compact module that can be easily installed and removed. Furthermore, the preferred embodiments also provide a cooling system that effectively facilitates heat dissipation from the densely packed module. These and other advantages of the present invention will become more fully apparent from the following description taken in conjunction with the accompanying drawings.

DETAILED DESCRIPTION OF THE PREFERRED EMBODIMENT

Figure 1:
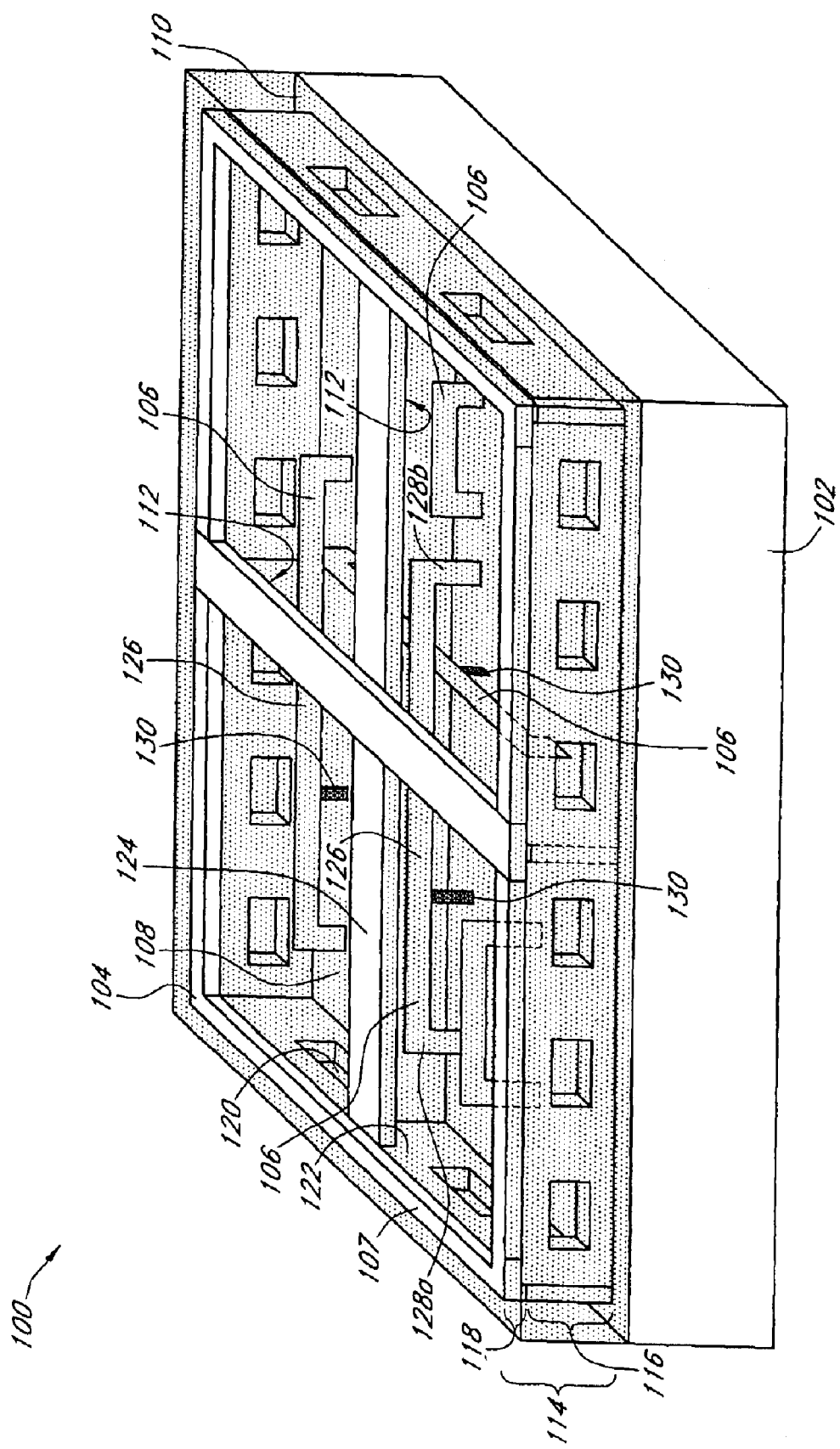
FIG. 1 is a partial schematic illustration of one embodiment of an integrated circuit chip that can be incorporated into a multiple chip stack module of the preferred embodiment.

References will now be made to the drawings wherein like numerals refer to like parts throughout. FIG. 1 is a partial schematic illustration of one embodiment of an integrated circuit chip 100 that can be incorporated into a multiple chip stack structure of the preferred embodiment. As shown in FIG. 1, the chip 100 comprises a substrate 102 such as a silicon substrate, that carries a variety of integrated circuitry and devices, such as capacitors, resistors, transistors, memory cells, and logic gates, that are formed using conventional semiconductor manufacturing processes. As also shown in FIG. 1, the chip 100 further comprises a support frame 104, a plurality of air bridge structures 106 and a temporary support material 107 that are each formed on an upper surface 108 of the substrate 102 using methods known in the art or, more preferably, in accordance with methods described in Applicant's co-pending U.S. patent application Ser. No. 09/382,929, entitled "PACKAGING OF ELECTRONIC CHIPS WITH AIR-BRIDGE STRUCTURES", which is incorporated by reference herein in its entirety.

As FIG. 1 illustrates, the support frame 104 is substantially rigid and extends from the upper surface 108 of the substrate 102 in a manner so as to protect the air bridge structures 106 and other interconnection wiring from being damaged by the weight of adjacent chips when the chip 100 is placed in a multi-chip stack. In one embodiment, the support frame 104 preferably extends along an outer perimeter 110 of the substrate 102 in a manner so as enclose the interconnection wiring formed on the upper surface 108 of the substrate 102. In another embodiment, the support frame 104 further includes a plurality of reinforcement ribs 112 that extend across the length and width of the substrate 102 to provide additional mechanical support and protection for the chip 100 and its interconnection wiring when the chip 100 is placed in a stack with other chips.

As FIG. 1 further illustrates, the support frame 104 defines a protected spatial region 114 extending above the upper surface 108 of the substrate 102. The spatial region 114 preferably comprises wiring levels 116 that are suitable for formation of air bridges 106 and other interconnection wiring. A wiring level is herein defined as a planar section above and substantially parallel to the upper surface of the substrate which contains air bridges and other conductors that extend in the same general plane. It can be appreciated that the chip 100 may comprise any number of wiring levels and is not limited to the number of wiring levels shown in FIG. 1.

Furthermore, the support frame 104 preferably has an upper portion 118 extending above the uppermost wiring level. The upper portion 118 preferably serves as a spacer separating the chip 100 from subsequently mounted adjacent chips. As will be described in greater detail below, the thickness of the upper portion 118 can be dimensioned in accordance with the particular spacing desired between adjacent chips. In one embodiment, the upper portion 118 is dimensioned so that the chip 100 when stacked in a multi-chip structure will be in proper alignment with conductive contacts, such as C4 contacts, positioned on chips that are subsequently mounted to the lateral faces of the multi-chip structure. Advantageously, the upper portion 118 of the support frame 104 may replace the conventional insulator spacer material that is typically interposed between adjacent chips in a chip stack. Because the upper portion 118 of the support frame 104 is substantially rigid and has a uniform thickness, it allows for more precise control and tuning of the distance separating adjacent chips in a chip stack.

Additionally, as shown in FIG. 1, the support frame 104 further comprises a plurality of openings 120 that are formed on a lateral surface 122 of the frame 104 using methods known in the art. As will be described in greater detail below, the openings 120 allow a thermally conductive medium, such as air, gas, or even liquid, to enter the spatial region 114 containing the air bridge structures 106 and circulate therethrough, thus removing heat generated from the conductors in the spatial region 114. Advantageously, the openings 120 permit a thermally conductive medium to circulate freely in and out of the spatial region 114 enclosed by the support frame 104 even when the chip 100 is placed in a stack with other chips. The openings 120 can be positioned at various locations on the support frame 104 and can take on a variety of different sizes and shapes without departing from the spirit of the invention.

In one embodiment, the support frame 104 is fabricated by depositing a layer of metal on the upper surface 108 of the substrate 102 using chemical vapor deposition (CVD), plasma enhanced CVD (PECVD), physical vapor deposition (PVD) techniques, sputtering, and/or electroforming. The metal layer is subsequently patterned and etched to define the configuration of the frame 104. In another embodiment, the support frame 104 and interconnection wiring for each wiring level are formed in the same process set using methods disclosed in Applicant's co-pending U.S. patent application Ser. No. 09/640,149, now U.S. Pat. No. 6,709,968, entitled "MICROELECTRONIC DEVICE WITH PACKAGE WITH CONDUCTIVE ELEMENTS AND ASSOCIATED METHOD OF MANUFACTURE", which is incorporated by reference herein its entirety. The support frame 104 can be made of a conductive material such as copper. Alternatively, the support frame 104 may comprise copper and an organic and/or inorganic insulating insert material. The insulating insert material is preferably incorporated in the reinforcement ribs 112 adjacent to where air bridge conductors are likely to extend through the ribs. In other embodiments, the support frame 104 may comprise an insulator made of organic and/or inorganic materials.

As FIG. 1 further shows, the temporary support material 107 formed on the upper surface 108 of the substrate 102 fills substantially the entire spatial region 114 comprising the interconnection wiring so as to stabilize and provide temporary structural support for the air bridges 106 and other circuitry therein. The temporary support material 107 permits the chip 100 to be processed and handled without causing damage to the air bridge conductors 106 or support frame 104 during subsequent process steps and by handling during assembly of the stack. The temporary support material 107 may be formed on the upper surface 108 of the substrate 102 using generally known chemical deposition processes. Preferably, the temporary support material 107 is polished back to a thickness that just exposes an upper surface 124 of the support frame 104 as shown in FIG. 1, which provides the chip with a leveled surface 124 for mounting as well as electrical bonding. The upper surface 124 of the support frame 104 and additional metal ledges (not shown) formed on the outside of the support frame 104 can be used to facilitate electrical detection of the end points during the process of removing the support material 107.

As described above, the temporary support material 107 stabilizes the air bridge structures 106 and the support frame 104 formed on the substrate. 102, thus allowing the chip 100 to be handled and processed without being damaged. As such, the support material 107 preferably is not removed until the chip 100 has been assembled into a multi-chip stack. In one embodiment, the temporary support material 107 may comprise carbon or other materials that can be oxidized or otherwise chemically removed with relative ease. In another embodiment, the temporary support material 108 may comprise a polymer such as high temperature polyimide, a photoresist, parylene such as parylene C or any combinations thereof.

Furthermore, as shown in FIG. 1, the air bridge structures 106 are formed above the upper surface 108 of the substrate 102 to electrically interconnect a first and a second exposed contact 128*a*, 128*b* extending from the upper surface of the substrate 102. Each air bridge structure 106 generally comprises a conductor 126 that is suspended by the two or more conductive contacts 128*a*, 128*b*. As described above, the conductors 126 are stabilized and supported by the temporary support material 107, but will become suspended in air once the temporary support material 107 is removed. The air bridges 106 can be formed using methods known in the art such as damascene or dual damascene processes. Furthermore, Applicant also discloses a method of forming air bridge interconnects in U.S. Pat. No. 5,891,797 to Farrar entitled "METHOD OF FORMING A SUPPORT STRUCTURE FOR AIR BRIDGE WIRING OF AN INTEGRATED CIRCUIT," which is hereby incorporated by reference in its entirety. In one embodiment, the air bridge structures 126 may be fabricated using conductive materials, such as aluminum, copper, gold, silver, platinum, polysilicon, and amorphous silicon. In addition, methods for depositing conductive air bridge interconnects may include deposition processes, such as chemical vapor deposition (CVD), and physical vapor deposition (PVD), electroplating, electroless plating, sputtering and electron beam evaporation or various liquid deposition techniques.

As FIG. 1 also shows, the air bridge conductors 126 may be further supported by a plurality of intermediate posts 130 that are formed on the upper surface 108 of the substrate 102. Once the temporary support material 107 is removed from underneath the conductors 126, the posts 130 are preferably used to support the longer air bridge conductors as the longer conductors may sag in the center and touch a neighboring air bridge interconnect, which may cause an electrical short therebetween. To reduce the occurrence of sagging, some longer air bridge interconnects may require more than one intermediate posts along the length of the bridge. The posts 130 may be formed using methods generally known in the art or those described in U.S. Pat. No. 5,891,797 to Farrar, or, more preferably, methods described in Applicant's co-pending Application entitled "PACKAGING OF ELECTRONIC CHIPS WITH AIR-BRIDGE STRUCTURES". In one embodiment, the posts 130 are comprised of an insulating material such as $SiO_2$ or a polymer such as polyimide. In another embodiment, the posts 130 are comprised of the same material as the air bridge conductors 124, however insulator inserts are interposed between the posts and the substrate.

Figure 2:
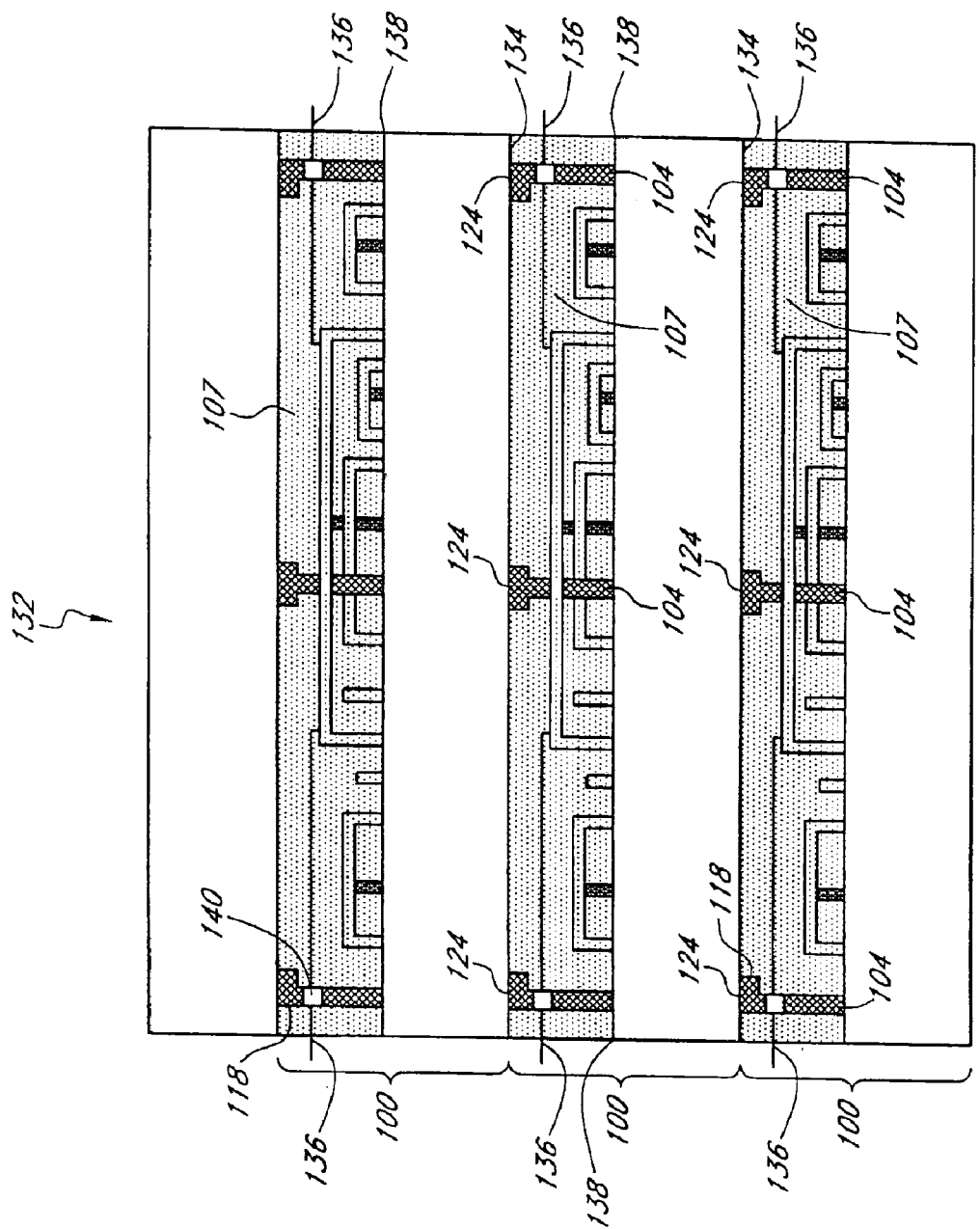
FIG. 2 is a partial schematic cross-sectional view of a chip stack incorporating the chip shown in FIG. 1.

FIG. 2 provides a partial schematic cross-sectional view of a chip stack 132 incorporating the chip 100 described and shown in FIG. 1. The chip stack 132 comprises a plurality of chips 100 that are stacked together in a manner such that the upper surface 124 of the support frame 104 of one chip is positioned adjacent to a lower surface 134 of the substrate 102 of another chip. The chips 100 may be bonded to each other using C4 contacts and/or adhesives as described in the Applicant's co-pending U.S. patent application Ser. No. 09/932,859 entitled "A THREE DIMENSIONAL MULTI-CHIP STRUCTURE AND METHOD OF MAKING THE SAME", now U.S. Pat. No. 6,433,413 issued Aug. 13, 2002, which is incorporated by reference herein its entirety.

Furthermore, as described above, the thickness of the upper portion 118 of the support frame 104 can be fine tuned in accordance with the distance desired between chips 100. In one embodiment, the temporary support material 107 is removed once the chip stack 132 is assembled. However, in embodiments that involve mounting additional exterior chips to the lateral faces of the chip stack and/or assembling the chip stack to other chip stacks, the temporary support material 107 is preferably removed after the assembly is completed. The temporary support material 107 is preferably chemically removed in a manner that does not damage the devices and circuitry formed on the chips. In one embodiment, the temporary material 107 is oxidized in an environment containing molecular oxygen or ozone or an oxygen plasma. In an oxidation process utilizing molecular oxygen, the process time, temperature and pressure can be increased to effectively remove substantially all carbon-based materials. In a plasma oxidation process, the lower pressures utilized are likely to facilitate complete removal of all organics. As such, it is desirable to use readily oxidized polymeric materials or carbon as the temporary support and/or spacer materials.

As FIG. 2 further shows, a plurality of conductive leads 136 extend from interconnects on the uppermost wiring level, through the support frame 104, and toward an outer edge 138 of the chip 100. Preferably, the leads 136 extend past the chip edge 138 and serve as electrical contact points with external circuitry. In cases where the support frame 104 is made of a conductive material, the leads 136 are preferably routed through an insulator insert 140 formed on the support frame 104 as shown in FIG. 2.

Figure 3:
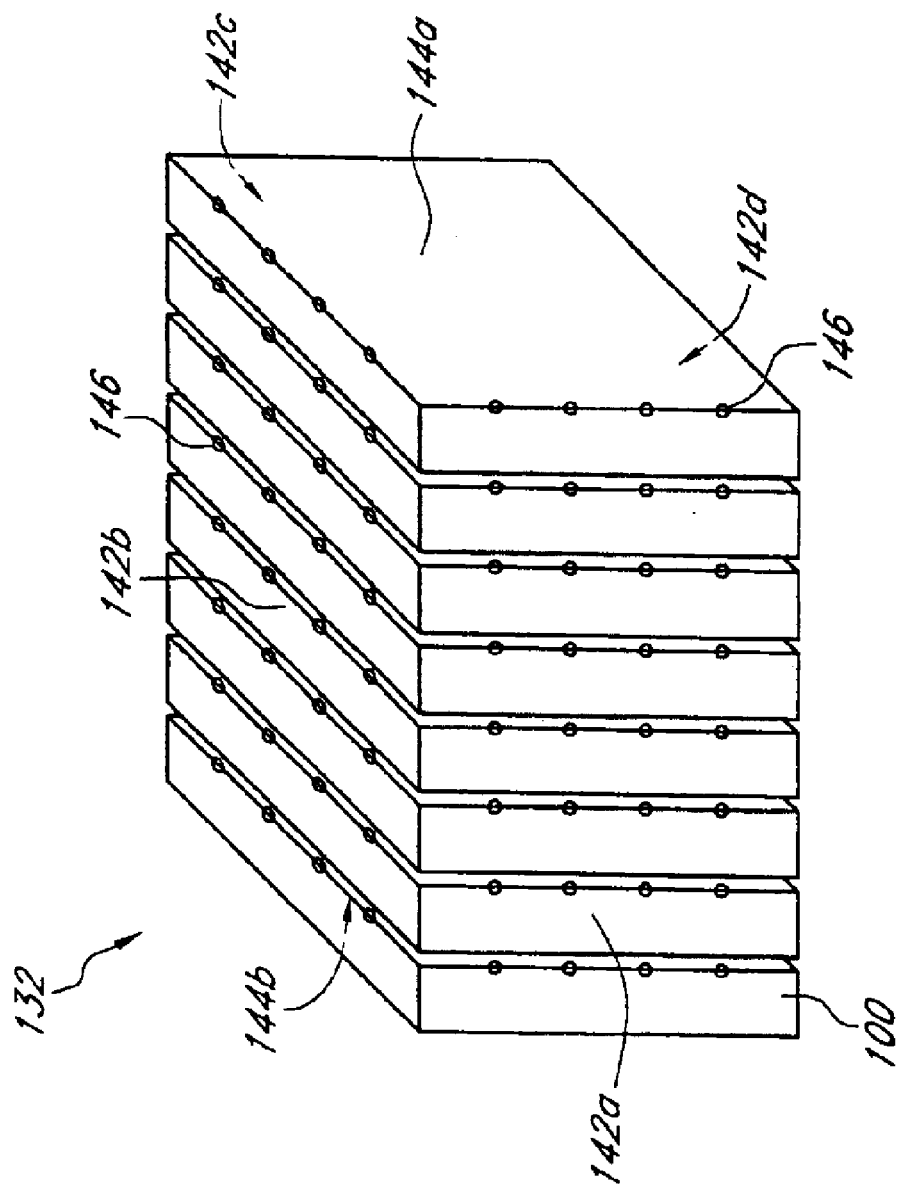
FIG. 3 is a schematic perspective view of the chip stack of FIG. 2.

FIG. 3 provides a schematic perspective view of the chip stack 132. As shown in FIG. 3, the chip stack 132 comprises a plurality of lateral faces 142*a, b, c, d* and an upper and a lower face 144*a, b*. Preferably, each lateral face of the stack 132 is comprised of a side surface of each chip 100 and the upper and lower faces 144*a, b* of the stack 132 comprise the respective outer substrate surfaces of the chips located on the ends of the stack. FIG. 3 also shows a plurality of electrical contacts 146 are formed the lateral faces 142*a, b, c, d* of the chips stack 132. These electrical contacts 146 are preferably interconnected to the conductive leads that extend from the upper wiring level of each chip 100. In one embodiment, the chips 100 in the stack 132 are memory chips. In another embodiment, only a portion of the chips in the chip stack 132 incorporate the air bridge structures and the support frames as described above while the remaining chips utilize conventional circuitry and spacer material between chips so as to improve the overall structural integrity and ruggedness of the chip stack 132.

Figure 4:
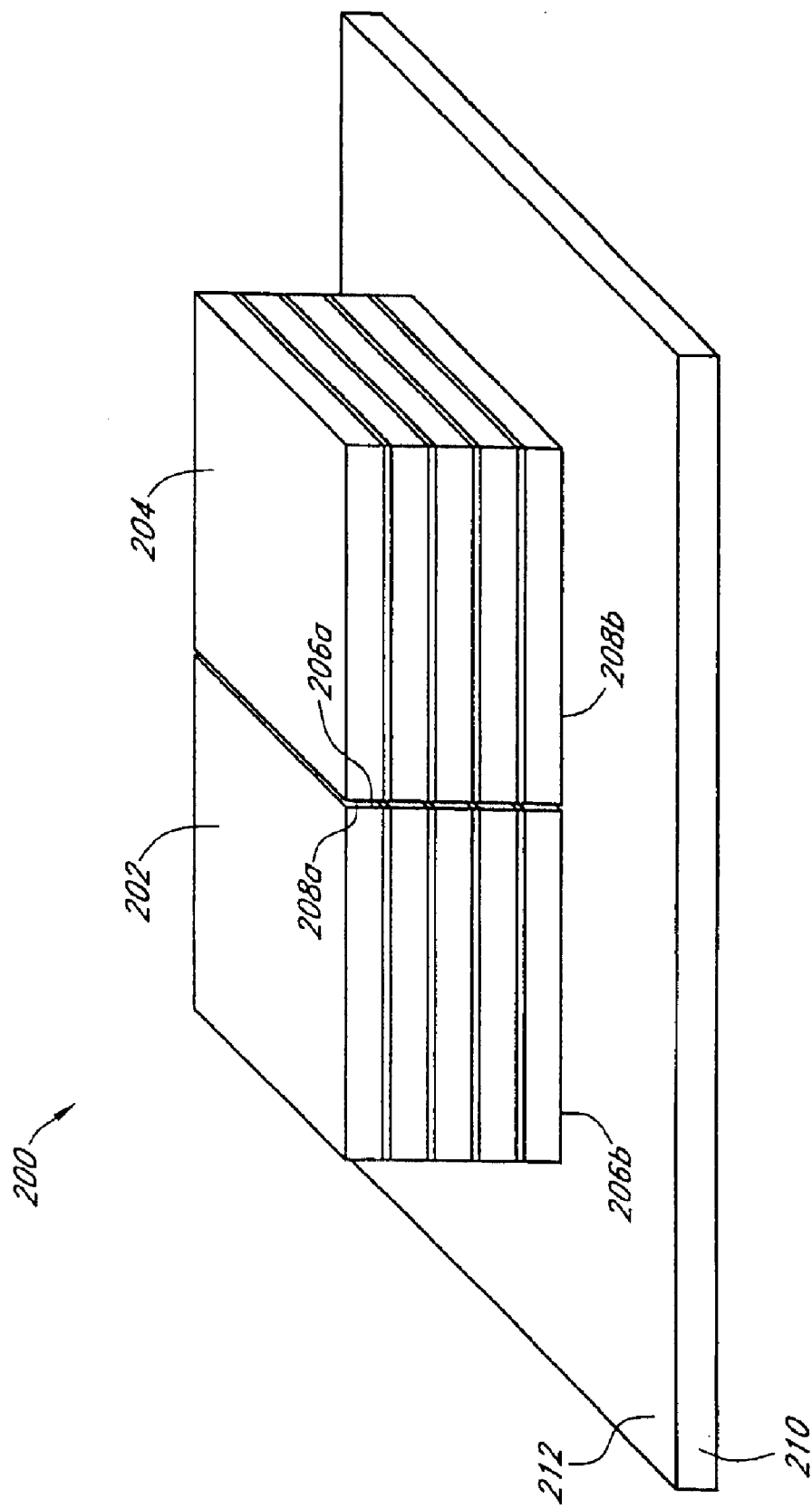
FIG. 4 is a schematic illustration of one embodiment of a multiple chip stack structure incorporating the chip stack of FIG. 3.

FIG. 4 illustrates one embodiment of an electronic module 200 of the present invention, which is comprised of a plurality of chip stacks joined together to form a single, compact structure. As shown in FIG. 4, the module 200 comprises two chip stacks 202, 204 that are bonded together in a side-by-side configuration. Each chip stack 202, 204 may be formed in substantially the same manner as the chip stack 132 shown in FIG. 3. Preferably, each chip stack has a plurality of lateral faces that are comprised of a side surface of each chip. As shown in FIG. 4, a first lateral face 206*a* of the first chip stack 202 is positioned immediately adjacent and attached to a first lateral face 208*a* of the second chip stack 204. In one embodiment, the first lateral faces 206*a*, 208*a* are bonded together by an adhesive and/or C4 connections. Furthermore, electrical contacts (not shown) may be formed on the first lateral faces 206*a*, 208*a* so that when the chip stacks 202, 204 are bonded together, electrical interconnection can be established between chips in the adjacent chip stacks 202, 204 without extensive wiring. Advantageously, joining together multiple chip stacks to form a single electronic module provides a high-density, compact structure that can be conveniently installed and removed as a single unit.

As FIG. 4 further shows, the electronic module 200 can be mounted to a bonding substrate 210 for external circuitry connection. In one embodiment, a lower surface 206*b*, 208*b* of both the first and second chip stacks 202, 204 of the module 200 are mounted to an upper surface 212 of the bonding substrate 210. Moreover, a metallized pattern may be formed on the upper surface 212 of the substrate 210 to establish interconnection with electrical contacts formed on the lower faces 206*b*, 208*b* of each chip stack 202, 204.

Figure 5:
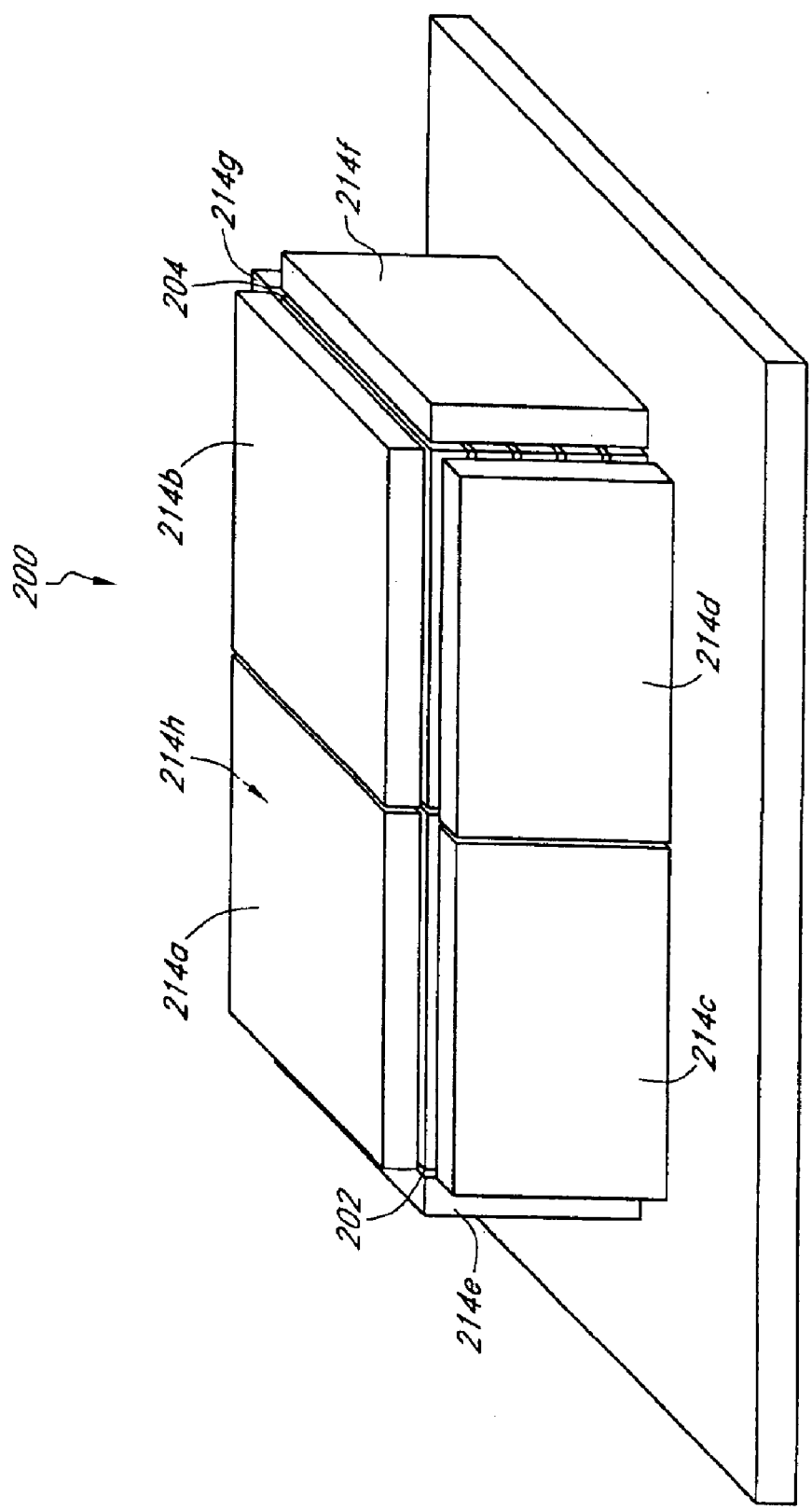
FIG. 5 is a schematic illustration of another embodiment of the multiple chip stack module, showing mounting of exterior chips.

FIG. 5 shows a plurality of exterior chips 214*a–h* are mounted to the remaining exposed faces of the chip stacks 202, 204, which include the second, third, and fourth lateral faces and the upper face. As shown in FIG. 5, an inner surface of each exterior chip 214*a–h* extends across at least a portion the respective face of the chip stacks 202, 204. In one embodiment, the chips within the chip stacks 202, 204 comprise memory chips while the exterior chips 214*a–h* comprise non-memory chips such as processor chips, logic chips, and A/D converter chips that may not be included in most conventional multi-chip modules due to overheating and chip interconnection problems. In another embodiment, the module 200 comprises chips sufficient to operate an entire system.

Furthermore, the exterior chips 214*a–h* can be mounted and interconnected to the chip stacks 202, 204 using C4 connections, modified C4 connections, and/or other methods disclosed in Applicant's co-pending U.S. patent applications, entitled "A THREE DIMENSIONAL MULTI-CHIP STRUCTURE AND METHOD OF MAKING THE SAME", U.S. Pat. No. 6,433,413 issued Aug. 13, 2002 and "ANGLED EDGE CONNECTIONS FOR MULTICHIP STRUCTURES", U.S. patent application Ser. No. 09/944, 957 filed Aug. 30, 2001, now U.S. Pat. No. 6,635,960, which are hereby incorporated by reference. As described above, in one embodiment, the distance between rows of conductive interconnects on adjacent chips in the chip stacks are precisely fixed by the upper portions of the support frame on each chip so that the interconnects may be aligned with electrical contacts such as, C4 connections, formed on the exterior chips.

Figure 6:
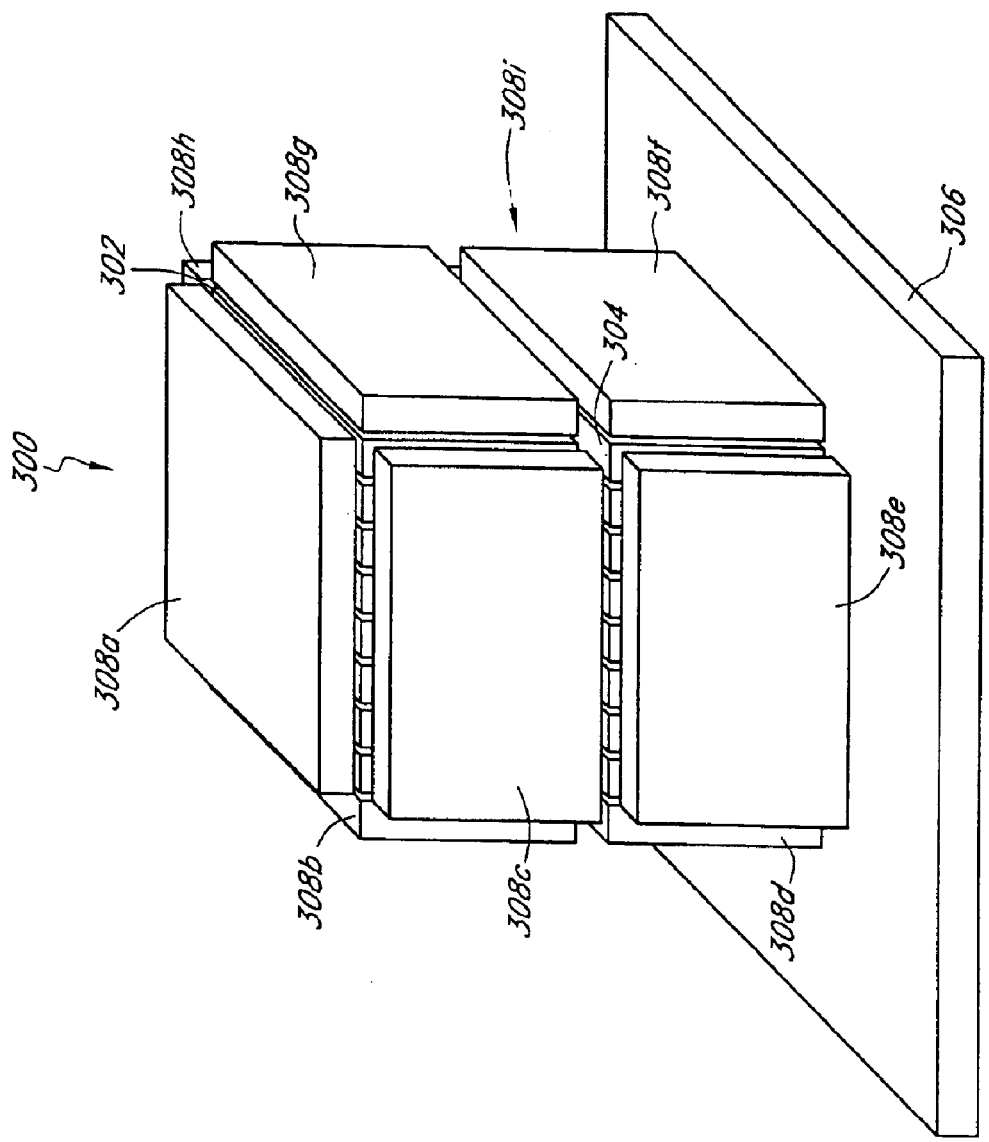
FIG. 6 is a schematic illustration of another embodiment of the multiple chip stack module.

FIG. 6 provides a schematic illustration of another embodiment of an electronic module 300 of the present invention. As shown in FIG. 6, the module 300 comprises two chip stacks 302, 304 that are bonded to each other in a substantially similar manner as the module 200 shown above in FIG. 5. In this embodiment, however, the chip stacks 302, 304 are placed in a vertical configuration and only one of the chip stacks 304 is attached to a bonding substrate 306. Preferably, the chip stacks 302, 304 are electrically interconnected to each other via contacts formed on the first lateral faces of the stacks when the stacks are bonded together. As also shown in FIG. 6, a plurality of exterior chips 308a–i are mounted to the exposed faces of the chip stacks 302, 304.

Figure 7:
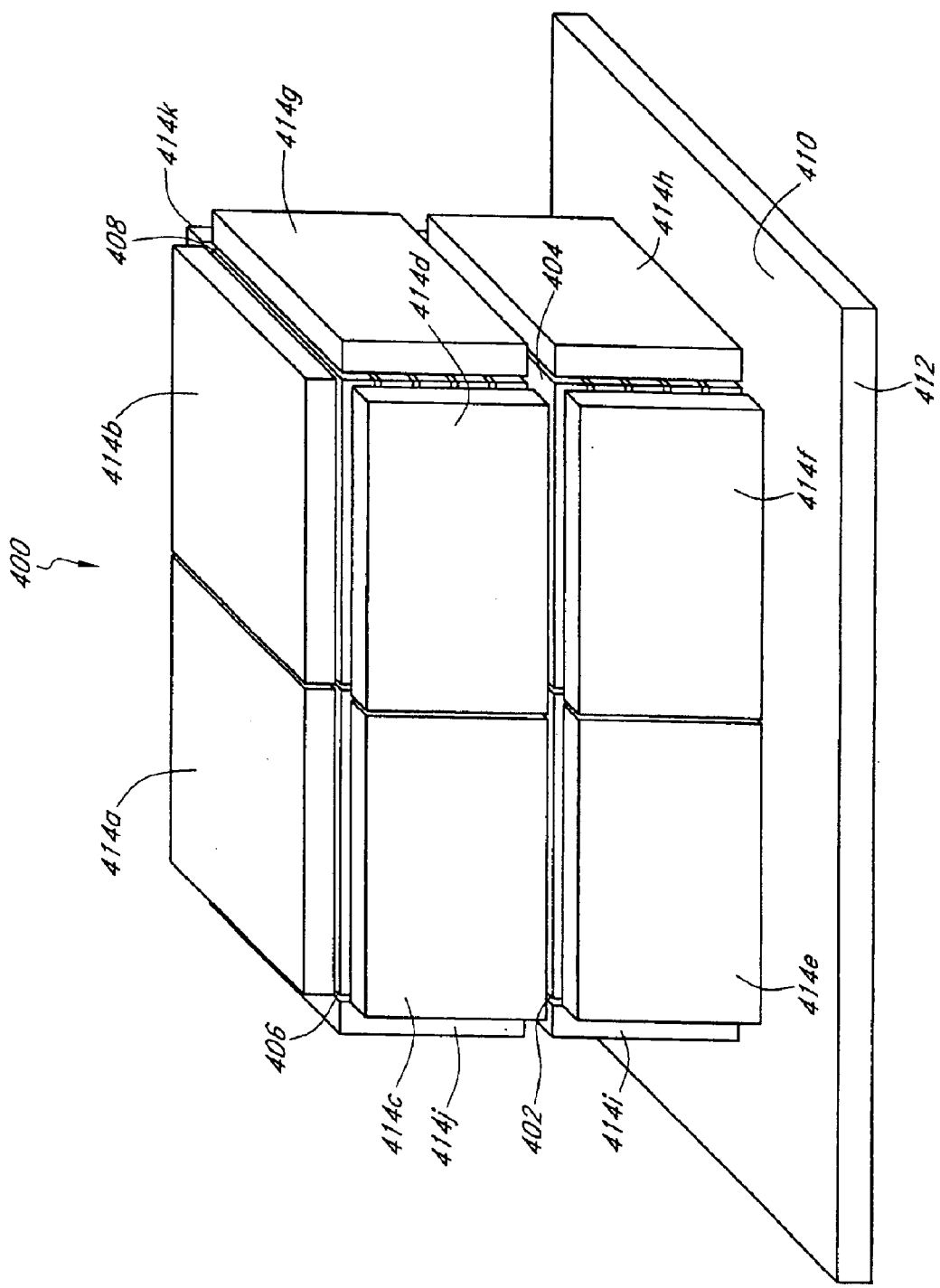
FIG. 7 is a schematic illustration of another embodiment of the multiple chip stack module, showing four chip stacks.

FIG. 7 shows yet another embodiment of an electronic module 400 of the present invention. In this embodiment, the module 400 comprises four chip stacks 402, 404, 406, 408 that are adhered together in a manner such that two chip stacks 402, 404 are bonded side-by-side while two additional chip stacks 406, 408 are positioned on an upper face of each respective stack 402, 404. As FIG. 7 also shows, the module 400 is in turn mounted to an upper surface 410 of a bonding substrate 412. Preferably, the chip stacks are electrically interconnected to each other via electrical contacts formed on the lateral faces of each stack. Furthermore, a plurality of exterior chips 414a–n are also mounted to the remaining exposed faces on the chip stacks. Preferably, the exterior chips are connected to each other and to the chip stacks using edge connections and C4 connections. In one embodiment, active and passive devices in a first chip stack may be wired via edge connections to selected conductive interconnects on an adjacent chip stack. In another embodiment, active and passive devices in the first and second chip stacks may be wired via edge connections to those in a third chip stack, which can be mounted directly on a bonding substrate using conductor lines, that may by-pass intermediately positioned devices. Wiring and interconnecting of the multiple chip stack assembly may be further increased by using front-to-back electrical vias that pass through the chip structures in the chip stacks located on the outer surfaces of the stack.

Advantageously, the electronic module of the preferred embodiments provide increased flexibility for electrically interconnecting large assemblies of active and passive devices located within various chip stacks. In addition, increased flexibility is evident when interfacing a plurality of chip stacks with a computer hardware system. The potential increase in wiring density by bonding multiple chip stacks into a single electronic package is substantial. For instance, one module may comprise connecting three to seven non-memory chips to 64 memory chips. The number of memory chips interconnected may be doubled by using semiconductor chips having half of the conventional thickness. Accordingly, an electronic module containing four chip stacks, stacked two high by two wide on a substrate as shown in FIG. 7, may comprise 256 memory chip and 14 non-memory chips. Furthermore, it can be appreciated that the manner in which multiple chips stacks can be joined is not limited to the above described configurations. For example multiple chip stacks may be assembled into a single module in a number of configurations: e.g., stacked side by side on the substrate, one chip stack positioned between the substrate and another chip stack. It can also be appreciated that the number of chip stacks that may be joined together into a single structure is also not limited to the examples shown and described above.

Figure 8:
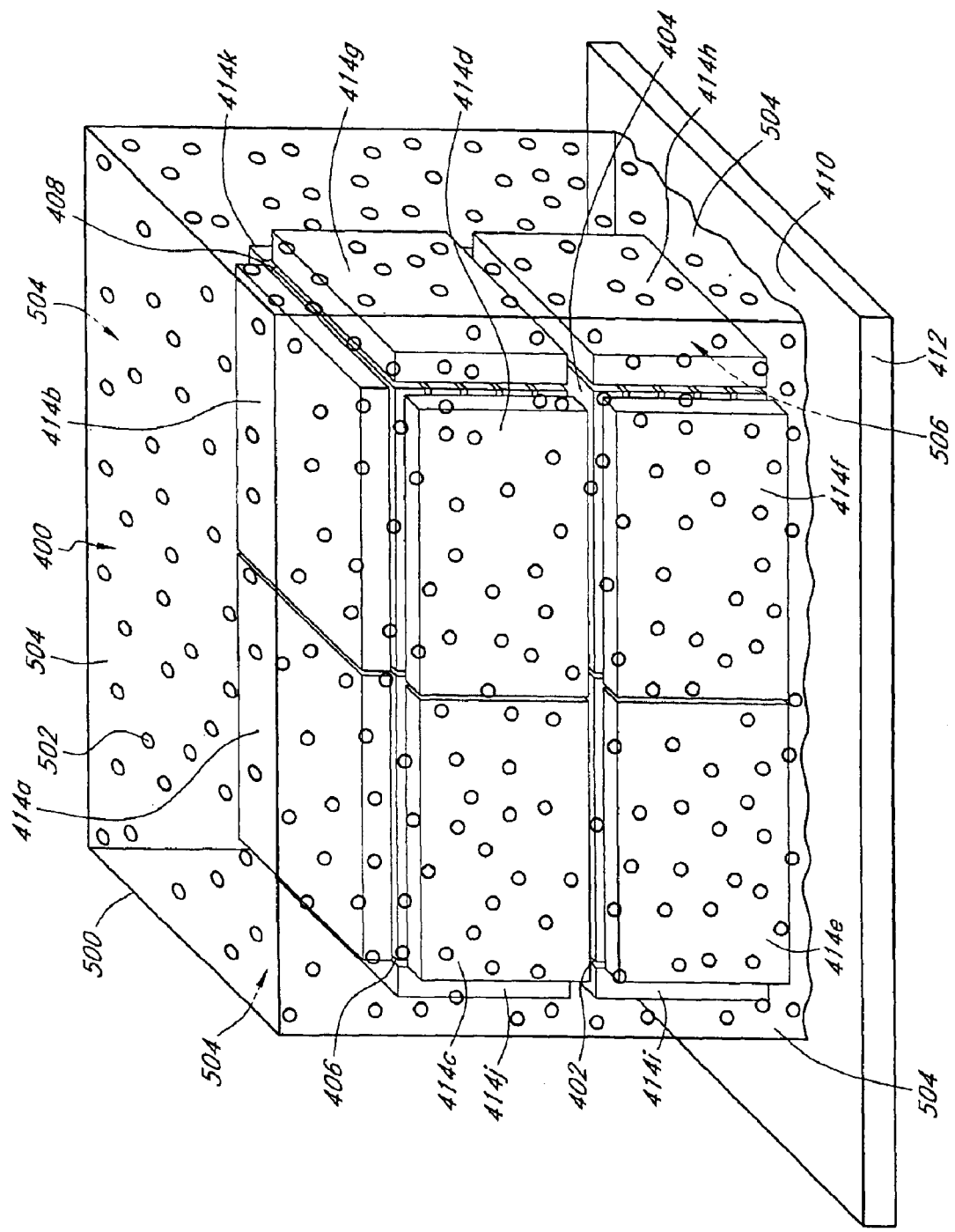
FIG. 8 is a schematic illustration of a high-density electronic packaging module of the preferred embodiment incorporating the multiple chip stack module of FIG. 7 inside an enclosure.

FIG. 8 provides a schematic illustration of the electronic module 400 of FIG. 7 in which the module is enclosed in an enclosure 500 filled with a thermally conductive medium 502. As shown in FIG. 8, the enclosure 500 comprises a plurality of walls 504 defining an interior space 506 that is sufficiently large to contain the multi-chip structure 400 and still retain sufficient free space to permit the thermally conductive medium 502 to circulate around the multi-chip structure 400. Preferably, the thermally conductive medium 502 acts as a heat sink by contacting the air bridges and other circuitry and devices in the multi-chip structure and transferring heat generated therefrom to the thermally conductive medium. Although the chips are stacked together, the thermally conductive medium 502 is able to circulate to and from the air bridge structures and other conductors within the stack by traveling through the openings formed on the lateral surfaces of the support frames in each chip.

In one embodiment, the enclosure 500 is placed over the electronic module 400 and attached to the upper surface 410 of the bonding substrate 412. Preferably, the enclosure is hermetically sealed to the bonding substrate so as to isolate the module 400 from the external environment and to retain the thermally conductive medium 502 inside the enclosure. The enclosure 500 may be formed of an insulator material or a conductive material, such as glass or metal, in a manner known in the art. Preferably, the enclosure 500 is comprised of a copper alloy having a high thermal conductivity and sufficiently rigid to support a pressurized fluid. Moreover, the enclosure 500 is preferably comprised of a material that inhibits diffusivity of the thermally conductive medium 502.

In one embodiment, the thermally conductive medium 502 comprises a thermally conductive gas having a thermal conductivity greater than that of air at one atmosphere. Preferably, the gas comprises pure hydrogen, helium, or a hydrogenhelium gaseous mixture. There are a number of advantages in selecting a hydrogenhelium gaseous mixture as the thermally conductive medium. First, the thermal conductivities of hydrogen and helium are similar to each other and much higher than those of most other gases. Second, the permeability or diffusivity of molecular hydrogen through some metals, glasses, and other enclosures is significantly smaller than that of helium, and hence is less prone to diffuse out of an enclosure over time. However, the use of pure hydrogen gas may raise some safety concerns under certain operating conditions. Thus, a hydrogen/helium gas mixture provides a gas mixture that has high thermal conductivity, relatively low diffusivity, and yet does not raise any substantial safety concerns. In one embodiment, the gas mixture comprises about 10% hydrogen and 90% helium. Other embodiments may comprise various other ratios of hydrogen to helium.

Furthermore, the thermally conductive medium 502 may be pressurized so as to increase the density of the gas mixture that is enclosed by the enclosure 500. In one embodiment, the pressure of the thermally conductive fluid is maintained between a range of 5 MPa and 50 MPa. Advantageously, the thermal conductivities of hydrogen and helium are approximately proportional to their pressures and the thermal conductivity of a pressurized mixture of hydrogen and helium is remarkably high. For example, a hydrogen/helium gas mixtures at pressures of about 5 to 50 MPa yield thermal conductivities of about $1.6 \times 10^{-3}$ to $1.6 \times 10^{-2}$ cal-cm/sec, respectively. When compared with a thermal conductivity value of about $2.3 \times 10^{-2}$ for fused silicon and about $5.7 \times 10^{-5}$ for air at atmospheric pressure, a hydrogen/helium mixture at 50 MPa pressure is almost 300 hundred times that of air at atmospheric pressure. However, it can be appreciated that the optimum gas compositions and pressures will vary with the particular application being used. For example, in relatively larger volume packages, less helium-rich mixtures may suffice since loss of helium via out-diffusion through the enclosure may be insignificant. In small electronic packages, the use of pure hydrogen may be preferred since the thermal conductivity may be higher, out-diffusion may be negligible, and safety concerns may be relatively insignificant. It can also be appreciated that the thermally conductive medium is not limited to any gaseous mixture and may comprise any type of thermally conductive fluid, including liquids.

Although the electronic module 400 of the preferred embodiment comprises air bridge structures that utilize air gap as an insulator, the module 400 is not limited to multi-chip structures that incorporate air insulators. In fact, the module 400 may incorporate chip stacks that utilize various approaches for insulating the metallurgical interconnection layers including low thermal conductivity spacer layers, such as low density polymeric foams, and/or insulator structures, such as silicon dioxide films and/or various hybrid insulating approaches. Implementation of the disclosed embodiments may be compatible with flip-chip bonding of the entire assembly to a ceramic substrate or other substrate. Furthermore, the enclosure 500 may be cooled using generally known cooling techniques, such as heat pipes, liquid coolants, external fins, and/or convective cooling fans.

Advantageously, the unique spacing configuration of the electronic module 400 permits efficient cooling by utilizing a pressurized, thermally conductive medium as a heat sink. The hermetically sealed enclosure permits efficient, pressurized cooling of the multi-chip structures, which may increase the reliability of the chip structures by reducing the occurrence of thermal breakdown associated with the self-overheating of integrated circuit components. Furthermore, increasing system reliability may reduce the incidence of system malfunctions.

As discussed above, densely packed integrated circuit chips such as those in a multi-chip structure tend to produce an increased amount of heat during normal operation. Therefore, an efficient system of cooling the chip by transferring a substantially amount of heat away from the chip improves the performance and reliability of the chip by reducing self-overheating. Advantageously, the electronic packaging module of the preferred embodiment provides a chip stack having open spaces created between adjacent chip substrates to allow a thermally conductive gas mixture or liquid to readily permeate the spaces and reach the air bridge conductors and other circuitry therein, which substantially reduces thermal hot spots within the multi chip electronic package. Furthermore, integrated circuit chips of an entire system may be reliably packaged in a single, electronic module in a convenient, highly compact, and cost-efficient manner.

An advantage to utilizing the multiple chip stack module is that both memory chips and non-memory chips may be combined in a single electronic package with the multiple stack providing an increased number of favorable surface positions to mount non-memory chips. As such, multiple chip stacks comprising chips of an entire system may be packaged into a smaller, more compact stacked multi-chip structure to thereby significantly reduce the amount of required space needed to accommodate various of individual integrated circuit elements internal to a system. A fully assembled electronic module of the preferred embodiment may be conveniently plugged into a computer, machine, or other instrument as a micro-unit, which may increase efficiency, functionality, flexibility, and performance. Additionally, even though these multi-chip electronic structures and/or packages may generate high amounts of heat per unit area during normal operation, the unique spacing configuration permits efficient cooling by utilizing a pressurized, thermally conductive fluid as a heat sink. The hermetically sealed enclosure permits efficient, pressurized cooling of the chip stacks, which may increase the reliability of the chip structures by reducing the occurrence of thermal breakdown associated with the self-overheating of integrated circuit components. Furthermore, increasing system reliability may reduce the incidence of system malfunctions.

Although the foregoing description of the various embodiments of the invention have shown, described, and pointed out the fundamental novel features of the present invention, it will be understood that various omissions, substitutions, and changes in the form of the detail of the apparatus as illustrated as well as the uses thereof, may be made by those skilled in the art, without departing from the scope of the present invention. Consequently, the scope of the present invention should not be limited to the foregoing discussions, but should be defined by the appended claims.

What is claimed is:

1. A method of forming an electronic packaging module, comprising:

securing a first plurality of integrated circuit chips in a first chip stack, wherein the first chip stack comprises a first lateral face wherein the first lateral face comprises a portion of each chip;

securing a second plurality of integrated circuit chips in a second chip stack, wherein the second chip stack comprises a first lateral face wherein the first lateral face comprises a portion of each chip;

bonding the first lateral face of the first chip stack to the first lateral face of the second chip stack so as to form a single module;

electrically interconnecting the module to a bonding substrate, wherein the bonding substrate comprises external circuitry.

2. The method of claim 1, further comprising:

enclosing said module inside an enclosure;

introducing a thermally conductive fluid to said enclosure, said thermally conductive fluid has a thermal conductivity greater than that of air at one atmosphere, wherein said thermally conductive fluid contacts the chip stacks and transfers heat therefrom.

3. The method of claim 2, wherein introducing said thermally conductive fluid into said enclosure comprises introducing a gas mixture comprising helium and hydrogen.

4. The method of claim 3, wherein said gas mixture is at a pressure higher than pressure external to the enclosure.

5. The method of claim 1, wherein securing the first chips in the first chip stack comprises securing one or more chip substrates in a stack in a manner such that a plurality of openings are formed between two adjacent chip substrates in a manner so as to permit a fluid to circulate in a region between the substrates, thereby providing cooling for the chip stack.

6. The method of claim 1, wherein securing the first chips in the first chip stack comprises securing one or more chip structures having a plurality of air bridge structures formed on a substrate of the chip, wherein said air bridge structures are stabilized and supported by a temporary support material.

7. The method of claim 6, further comprising removing the temporary support material stack after electrically connecting the module to the bonding substrate.

8. The method of claim 6, further comprising removing the temporary support material after bonding the first chip stack to the second chip stack.

* * * * *